United States Patent
Bach et al.

(10) Patent No.: US 6,793,784 B1
(45) Date of Patent: Sep. 21, 2004

(54) TUBE TARGET

(75) Inventors: Otto Bach, Schöneck (DE); David Lupton, Gelnhausen (DE); Hans Bohmeier, Freiberg (DE); Ralf Heck, Hanau (DE)

(73) Assignee: W. C. Heraeus GmbH & Co. KG (DE)

( * ) Notice: Subject to any disclaimer, the term of this patent is extended or adjusted under 35 U.S.C. 154(b) by 341 days.

(21) Appl. No.: 09/707,058

(22) Filed: Nov. 6, 2000

(30) Foreign Application Priority Data

Nov. 5, 1999 (DE) .......................................... 199 53 470

(51) Int. Cl.⁷ .............................................. C23C 14/34
(52) U.S. Cl. ........................... 204/298.12; 204/298.13; 204/298.21; 204/298.22
(58) Field of Search ....................... 204/298.12, 298.13, 204/298.21, 298.22

(56) References Cited

U.S. PATENT DOCUMENTS

| | | | |
|---|---|---|---|
| 4,211,269 A | 7/1980 | Bentz et al. | 177/211 |
| 4,240,494 A | 12/1980 | Kryanin et al. | 164/66.1 |
| 5,096,562 A * | 3/1992 | Boozenny et al. | 204/298.22 |
| 5,308,978 A | 5/1994 | Cottrell et al. | 250/288 |
| 5,354,446 A | 10/1994 | Kida et al. | 204/298.22 |
| 5,403,458 A * | 4/1995 | Hartig et al. | 204/192.15 |

FOREIGN PATENT DOCUMENTS

| | | |
|---|---|---|
| DE | 27 23 173 C2 | 12/1978 |
| DE | 690 24 810 T2 | 3/1991 |
| DE | 41 17 367 C2 | 12/1992 |
| DE | 42 43 757 | 6/1994 |
| EP | 0 500 031 A1 | 8/1992 |
| FR | 2 745 010 | 8/1997 |
| JP | 55 050 958 | 4/1980 |
| JP | 03 104 840 | 5/1991 |
| JP | 03 153 867 | 7/1991 |
| JP | 03 153 868 | 7/1991 |
| JP | 05-125523 * | 5/1993 |

OTHER PUBLICATIONS

Article entitled "Grundlagen und Technologie der Schieudergiessverfahren" by Dr. habil, et al., dated 1977, 21 pages.
Article entitled "Fortschritte bei der Herstellung und Anwendung von Stahlschleuderguβ" by Von Franz Pölzguter, pp. 4243–4250 apprsting in Foundary Trade J. 98 dated 1955.
Article entitled "Nichteisenmetall–Schleuderguβ" by Hermann Roeder appearing in Industrie–Anzeiger, Essen dated Aug. 31, 1956, pp. 1058–1059.
Article entitled "Integration of Target Manufacturing in the Sputtering Plant" by P. Lippens appearing in 1996 Society of Vacuum Coaters, pp. 424–430.

* cited by examiner

*Primary Examiner*—Rodney G. McDonald
(74) *Attorney, Agent, or Firm*—Ostrolenk, Faber, Gerb & Soffen, LLP

(57) ABSTRACT

A tube target for cathode sputtering installations, and a process for producing a cylindrical hollow body for such a tube target and its use. The problem of providing a simple and low-cost process for producing a cylindrical hollow body for a tube target and of providing a cylindrical hollow body with a uniform, fine-grained structure is solved by the cylindrical hollow body being produced by centrifugal casting of a melt.

4 Claims, No Drawings

TUBE TARGET

BACKGROUND OF THE INVENTION

1. Field of the Invention

The invention relates to a tube target for cathode sputtering installations, to a process for producing a cylindrical hollow body for such a tube target and to its use.

2. Discussion of the Prior Art

Rotating tube targets for cathode sputtering installations are known. They are primarily used for the production of coatings over large surface areas, for example for the coating of flat glass. In comparison with planar targets, tube targets permit a higher yield of target material, which is of major economic significance in particular in the case of high-value coating materials such as noble metals.

Various processes are known for the production of a target tube, or a cylindrical hollow body, from coating material. To achieve high sputtering performances with the tube target and a high degree of uniformity, or a uniform thickness of the coating produced, a uniform, fine-grained structure of the target material is aimed for.

For instance, a target tube can be produced from metal by casting a solid bar, forging the bar into a cylindrical billet and subsequently producing a tube by machining. The material yield in the case of this process is low, however, and the machining is complex. Moreover, high degrees of deformation are required to achieve a uniform, fine-grained structure.

The production of a metallic target tube may also be performed, however, by continuous casting with subsequent machining of the inside and outside diameters. Due to the slow solidification of the tube in continuous casting, however, a coarse-grained and consequently less suitable structure is produced. In the case of horizontal continuous casting, moreover, a nonuniform grain structure is formed over the tube cross section, leading to different rates of deposition.

A metallic target tube may also be produced by carrying out a forming operation on a thick strip to form a tubular geometry and closing the longitudinal seam by welding. However, the welded seam has a nonuniform structure, which differs from the material of the strip which has undergone the forming.

Production by means of extrusion of a hollow-cylindrical bolt is possible both for metallic coating materials and for ceramic coating materials. The material yield is low, however.

U.S. Pat. No. 5,354,446 describes a rotatable tube target on the magnetron principle with ceramic coating material for cathode sputtering. The target has a target holder, which has two metallic layers and, as the uppermost layer, a ceramic layer. The coefficients of thermal expansion of the two metallic layers are chosen such that a more or less smooth transition is produced between the coefficient of thermal expansion of the target holder and that of the ceramic layer. The production of the layers preferably takes place by complex processes such as plasma spraying or pressing layer particles onto the target holder by means of isostatic pressing or hot isostatic pressing.

French reference 2 745 010 describes a tube target for cathode sputtering which is composed of a plurality of elongate plates. The outer tube shape in this case preferably takes the form of a polygon. Elongate plates of standard materials in the form of metal sheets or bars may be used. The production of elongate plates from special materials can be performed by pressing, in particular by isostatic or hot isostatic pressing. The assembly of the plates to form a tube is performed by screwing, soldering or adhesive bonding.

SUMMARY AND DESCRIPTION OF THE INVENTION

Accordingly, it is an object of the present invention to provide a simple and low-cost process for producing a cylindrical hollow body for a tube target, and to provide a cylindrical hollow body with a uniform, fine-grained structure.

Pursuant to this object, and others which will become apparent hereafter, one aspect of the present invention resides in producing the cylindrical hollow body by centrifugal casting of a melt. A cylindrical hollow body is understood here as meaning a tubular blank which is processed into a target tube by machining and is subsequently assembled with further parts to form a tube target.

In the centrifugal casting process, the material for the cylindrical hollow body is cast into a geometry which is already "close to the final form", whereby only little machining of the inner and outer contours of the cylindrical hollow body being produced is subsequently required. This has the advantage of a high material yield. It has been found that the centrifugal casting has the effect that a very uniform grain structure is formed in the wall of the cylindrical hollow body, with columnar crystallites arranged essentially perpendicular to the circumference of the hollow body. This formation of the grain structure has the effect that the crystallites are always removed perpendicular to their thin cross section during a sputtering operation in a cathode sputtering installation. This means that the grain structure, and consequently the rate of deposition, do not change throughout the time during which the tube target is in use. Due to the centrifugal forces occurring during centrifugal casting, contaminants in the casting material, such as slag, carbon or graphite for example, or else gas bubbles, are displaced during centrifuging in the direction of the inside diameter of the hollow body which is being formed and can be removed in a simple way in the subsequent machining of the inner contour of the tube. This leads to a very clean and homogeneous grain structure of the target tube and consequently to a high quality of the tube target. Moreover, the waste material produced by the machining can for the most part be used again as returned material in the next casting. The proportion of returned material added may in this case generally be between 0% and 100%.

It has proven to be particularly advantageous if the cylindrical hollow body is produced by horizontal centrifugal casting in a rotating casting mold. The gas atmosphere should be adapted during the centrifugal casting to the cast material so that the cast material is influenced as little as possible in its properties. A gas atmosphere in the casting mold with a low oxygen partial pressure is of advantage here in most cases. Industrial gases such as natural gas or argon or forming gas or nitrogen can consequently be used in a simple way.

The cylindrical hollow body may be formed from a metal and/or a noble metal. Both a single-layer structure of the cylindrical hollow body from a single material and a multilayer structure from different materials are possible here. To produce a high-quality, multi-layer cylindrical hollow body by centrifugal casting, a cylindrical hollow body is for example produced from a noble metal and cooled. Before the inside diameter of this hollow body is provided with a further layer, the inner contour should be cleaned and smoothed by means of a machining step. Another melt of metal can then be introduced by centrifugal casting into the cylindrical hollow body machined in this way, the other melt covering the inside diameter of the cylindrical hollow body. In the case of materials with greatly differing coefficients of thermal expansion, an intermediate layer compensating for stresses may be provided.

The production of a cylindrical hollow body from silver is of commercial interest in particular. AgCuNi alloys, which are more favorable in handling on account of their greater strength in comparison with pure silver, and Ag materials with low doping levels, such as for example a fine-grained silver with 0.15% by weight of nickel, may also be used. It is particularly advantageous that cylindrical hollow bodies can be produced from alloys which cannot be produced by other processes on account of their unfavorable deforming properties.

It has proven successful if the rotational speed of the casting mold is set such that an acceleration acting on the melt to be introduced corresponds to 160 to 180 times the acceleration due to gravity.

The problem is solved for the tube target by the tube target having a centrifugally cast, cylindrical hollow body. With such a tube target, layers of uniform thickness over large surface areas can be achieved at a high rate of deposition.

The cylindrical hollow body may be formed from a metal and/or a noble metal. However, the cylindrical hollow body is preferably formed from silver.

Use of centrifugally cast, cylindrical hollow bodies for tube targets is of great advantage. Use of tube targets with centrifugally cast, cylindrical hollow bodies of silver for the coating of flat glass has proven successful in particular.

EXAMPLES

The following three examples serve to explain the invention by way of example.

Example 1: production of a cylindrical hollow body with a length of 1000 mm.

Example 2: production of a cylindrical hollow body with a length of 4000 mm.

Example 3: machining of the cylindrical hollow body.

EXAMPLE 1

A material comprising 70% by weight of silver granules and 30% by weight of silver from returned material is melted in a clay-graphite crucible, the silver melt being covered with charcoal or graphite. The silver melt is poured at a temperature of 1100° C. into a casting ladle, in which a preheated clay-graphite crucible is located. The silver melt is poured out of the casting ladle without interruption into the rotating casting mold, preheated to 100° C., of a horizontal centrifugal casting installation. The rotational speed of the casting installation is set such that the acceleration acting on the melt to be introduced corresponds to 160 to 180 times the acceleration due to gravity.

The outside diameter of the cylindrical hollow body is determined by the inside diameter of the casting mold, while the thickness of the wall of the hollow body is set by the amount of melt introduced. To largely avoid oxygen absorption of the silver melt, the mold is, flushed with natural gas during casting. The silver melt solidifies in a tubular form on the wall of the casting mold. The cylindrical hollow body produced can be removed from the casting mold after cooling and can be machined.

EXAMPLE 2

The production of the cylindrical hollow body is performed essentially as in Example 1. On account of the great length of 4000 mm, the temperature of the melt is chosen, however, at 1250° C. and the casting mold is preheated to 200° C.

EXAMPLE 3

The cylindrical hollow body removed from the casting mold is cut to length with a conventional band saw and the inside diameter is machined with a deep-drilling machine. If the deep-drilling method is used, a high material-cutting rate, close drilling tolerances, high alignment accuracy, exact geometry and high surface quality are produced. The machining of the outside diameter is performed on a long-bed lathe. To avoid bending in the case of the long cylindrical hollow bodies, the turned surface respectively being machined is supported by a steady rest (supporting shoe) running along with it and/or fixed steady rests.

The various features of novelty which characterize the invention are pointed out with particularity in the claims annexed to and forming a part of the disclosure. For a better understanding of the invention, its operating advantages, and specific objects attained by its use, reference should be had to the drawing and descriptive matter in which there are illustrated and described preferred embodiments of the invention.

We claim:

1. A tube target for a cathode sputtering installation, comprising a centrifugally cast, cylindrical hollow body as a sputtering material, the hollow body having a grain structure with columnar crystallites arranged substantially perpendicular to a circumference of the hollow body.

2. A tube target as defined in claim 1, wherein the cylindrical hollow body is formed from a metal.

3. A tube target as defined in claim 2, wherein the cylindrical hollow body is formed from silver.

4. A tube target as defined in claim 2, wherein the cylindrical hollow body is formed from a noble metal.

* * * * *